US012706139B2

(12) United States Patent
Huang et al.

(10) Patent No.: US 12,706,139 B2
(45) Date of Patent: Aug. 11, 2026

(54) LAYOUT PATTERN FOR STATIC RANDOM ACCESS MEMORY

(71) Applicant: UNITED MICROELECTRONICS CORP., Hsin-Chu City (TW)

(72) Inventors: Chun-Hsien Huang, Tainan City (TW); Yu-Tse Kuo, Tainan City (TW); Shu-Ru Wang, Taichung City (TW); Li-Ping Huang, Miaoli County (TW); Chun-Yen Tseng, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 418 days.

(21) Appl. No.: 18/218,025

(22) Filed: Jul. 4, 2023

(65) Prior Publication Data

US 2024/0404587 A1 Dec. 5, 2024

(30) Foreign Application Priority Data

Jun. 5, 2023 (TW) ................................ 112120856

(51) Int. Cl.
*G11C 11/412* (2006.01)
*G11C 5/06* (2006.01)

(52) U.S. Cl.
CPC ............ *G11C 11/412* (2013.01); *G11C 5/063* (2013.01)

(58) Field of Classification Search
CPC ........ H10B 10/00; H10B 10/12; H10B 10/18; G11C 5/06; G11C 5/063; G11C 11/412; G11C 11/413
See application file for complete search history.

(56) References Cited

U.S. PATENT DOCUMENTS

| | | | | |
|---|---|---|---|---|
| 8,009,463 | B2 | 8/2011 | Liaw | |
| 9,373,386 | B2 | 6/2016 | Liaw | |
| 9,824,747 | B2 | 11/2017 | Liaw | |
| 9,858,985 | B2 | 1/2018 | Liaw | |
| 10,153,287 | B1 * | 12/2018 | Wang | H10B 10/12 |
| 11,145,660 | B2 | 10/2021 | Yu | |
| 2014/0185365 | A1 | 7/2014 | Liaw | |
| 2017/0243861 | A1 * | 8/2017 | Wang | G03F 1/36 |
| 2019/0096892 | A1 * | 3/2019 | Wang | H10B 10/12 |
| 2023/0005936 | A1 | 1/2023 | Han | |
| 2023/0403837 | A1 * | 12/2023 | Huang | H10B 10/12 |

* cited by examiner

*Primary Examiner* — Brook Kebede

(74) *Attorney, Agent, or Firm* — Winston Hsu

(57) ABSTRACT

The invention provides a layout pattern of static random access memory (SRAM), which comprises a substrate, and a plurality of fin structures and a plurality of gate structures are located on the substrate to form a plurality of transistors. The plurality of transistors comprise a first pull-up transistor (PU1), a first pull-down transistor (PD1), a second pull-up transistor (PU2), a second pull-down transistor (PD2), a first access transistor (PG1A), a second access transistor (PG1B), a third access transistor (PG2A) and a fourth access transistor (PG2B). A first word line contact pad connected to a gate of the first access transistor (PG1A) and a first word line, and a second word line contact pad connected to a gate of the second access transistor (PG1B) and a second word line, the first word line contact pad and the second word line contact pad do not overlap in a vertical direction.

17 Claims, 5 Drawing Sheets

LAYOUT PATTERN FOR STATIC RANDOM ACCESS MEMORY

BACKGROUND OF THE INVENTION

1. Field of the Invention

The invention relates to a static random access memory (SRAM), and more particularly, to a SRAM having the advantages of higher yield and faster read speed.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as gap of the exposure process decreases, it has been difficult for the current SRAM architecture to produce desirable patterns. Hence, how to enhance the current SRAM architecture for improving exposure quality has become an important task in this field.

SUMMARY OF THE INVENTION

The invention provides a layout pattern of static random-access memory (SRAM), which comprises a substrate, wherein a plurality of fin structures are located on the substrate, each fin structure extends along a second direction (Y direction), and a plurality of gate structures are located on the substrate, each gate structure extends along a first direction (X direction) and spans the plurality of fin structures to form a plurality of transistors. The plurality of transistors comprise a first pull-up transistor (PU1), a first pull-down transistor (PD1), a second pull-up transistor (PU2), a second pull-down transistor (PD2), a first access transistor (PG1A), a second access transistor (PG1B), a third access transistor (PG2A) and a fourth access transistor (PG2B). A first word line contact pad connected to a gate of the first access transistor (PG1A) and a first word line, and a second word line contact pad connected to a gate of the second access transistor (PG1B) and a second word line, wherein the first word line contact pad and the second word line contact pad do not overlap in the second direction.

The invention provides A layout pattern of a static random-access memory (SRAM), which comprises a substrate, four SRAM cell regions, which are arranged in a 2*2 array and form the layout pattern of the SRAM, wherein each SRAM cell region comprises: a plurality of fin structures are located on the substrate, and each fin structure extends along a second direction (Y direction), a plurality of gate structures are located on the substrate, and each gate structure extends along a first direction (X direction) and spans the plurality of fin structures to form a plurality of transistors, wherein the plurality of transistors comprise a first pull-up transistor (PU1), a first pull-down transistor (PD1), a second pull-up transistor (PU2), a second pull-down transistor (PD2), a first access transistor (PG1A), a second access transistor (PG1B), a third access transistor (PG2A) and a fourth access transistor (PG2B, a first word line contact pad connected to a gate of the first access transistor (PG1A) and a first word line, a second word line contact pad connected to a gate of the second access transistor (PG1B) and a second word line, wherein the first word line contact pad and the second word line contact pad do not overlap in the second direction, a third word line contact pad connected to a gate of the third access transistor (PG2A) and the first word line, and a fourth word line contact pad connected to a gate of the fourth access transistor (PG2B) and the second word line, wherein the third word line contact pad and the fourth word line contact pad do not overlap in the second direction.

The present invention provides a layout pattern of a 8T-SRAM cell and a layout pattern of a combined array. One of the features of the present invention is that the word line contact pads contained therein are staggered, so as to avoid manufacturing difficulties caused by being too close to other adjacent word line contact pads. Another feature is that when a plurality of 8T-SRAM cells are arranged in an array, the patterns in the central region will mirror each other for different adjacent regions, but the word line contact pads in the peripheral regions still maintain the same arrangement direction, so that each region in the array and the word line contact pads in the adjacent regions can be staggered, and the yield of products can be improved.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
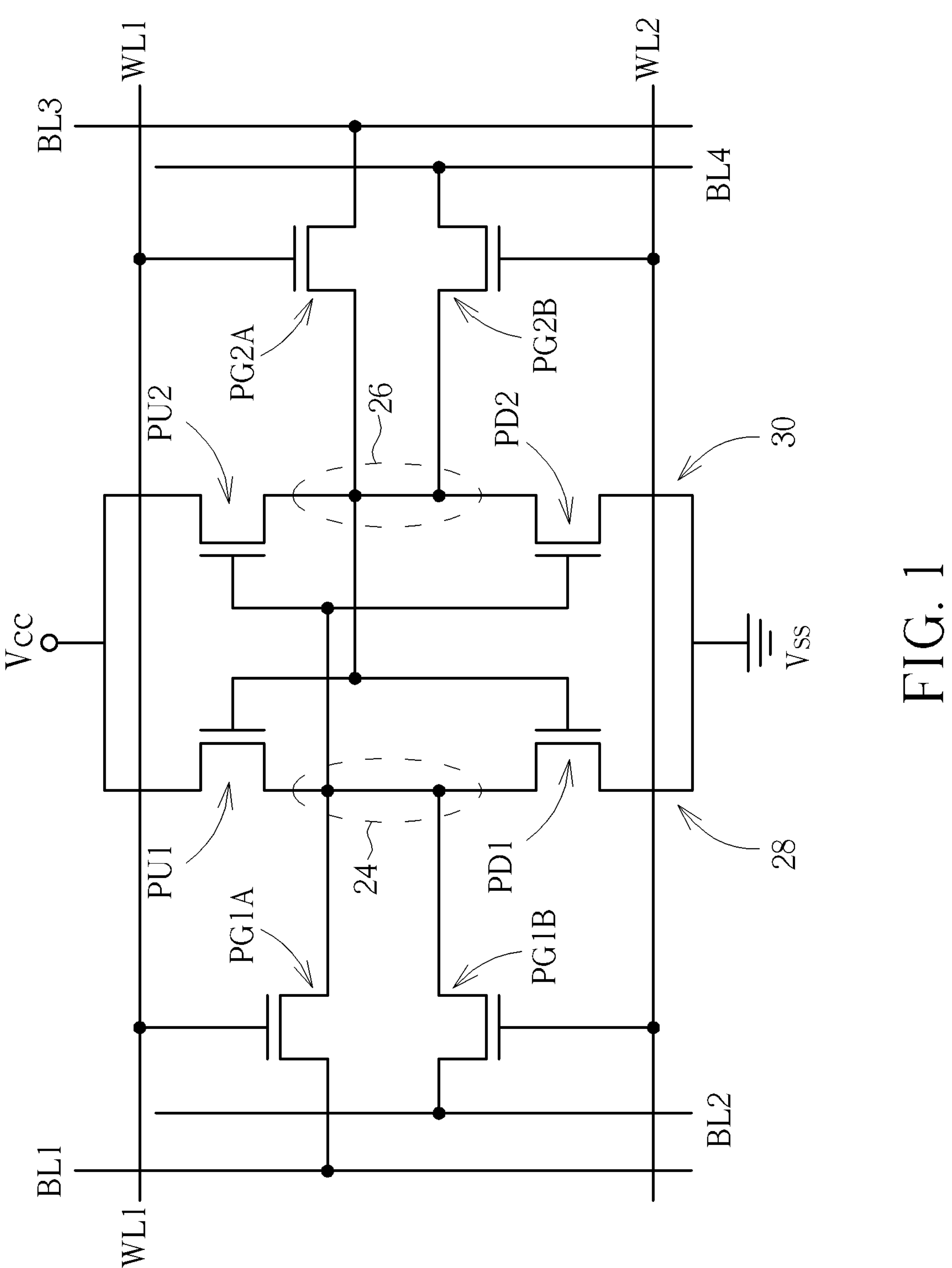
FIG. 1 illustrates a circuit diagram of an eight-transistor SRAM (8T-SRAM) cell according to a first preferred embodiment of the present invention.
Figure 2:
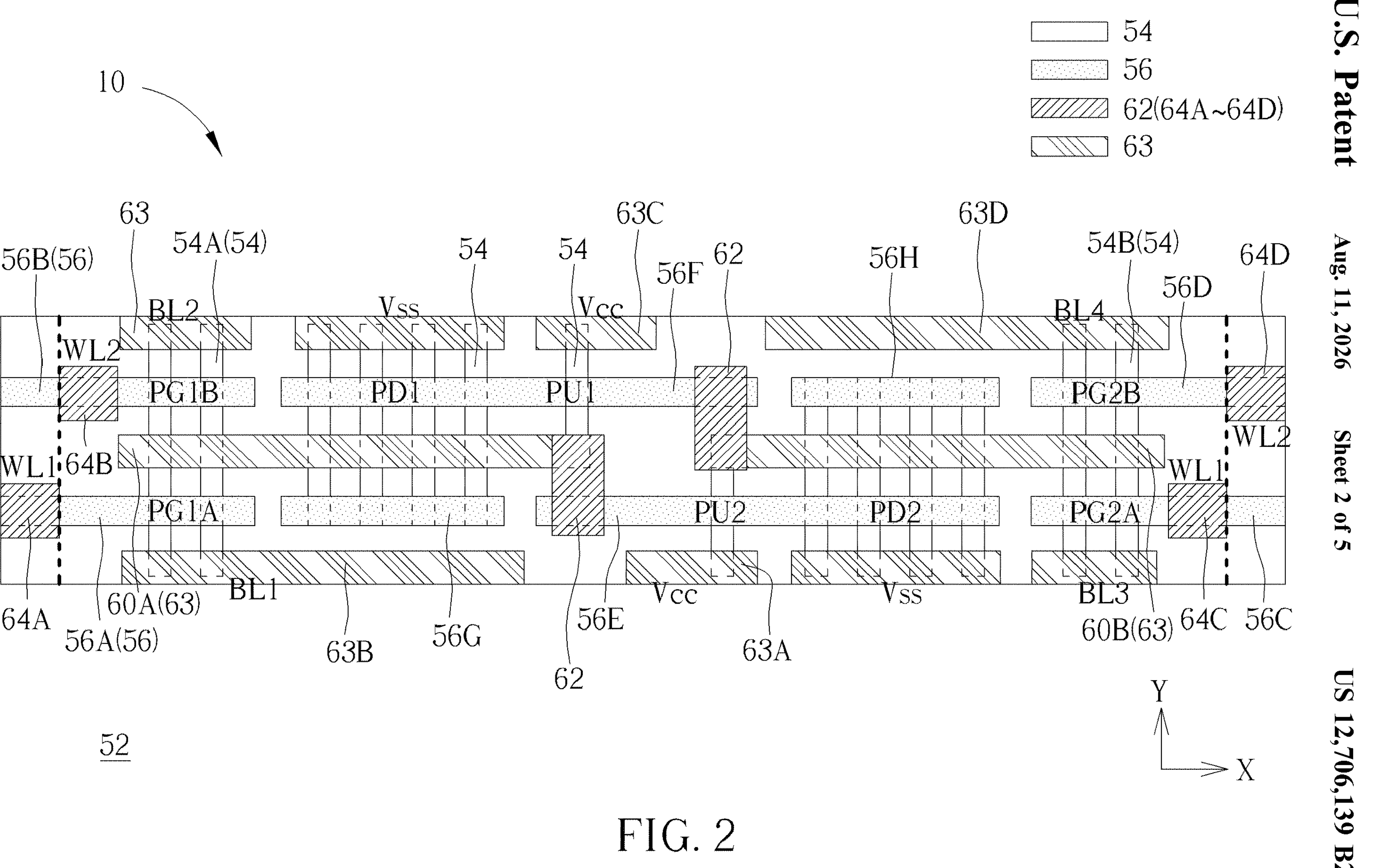
FIG. 2 is a layout diagram of a SRAM according to a preferred embodiment of the present invention.

Referring to FIGS. 1-2, FIG. 1 illustrates a circuit diagram of an eight-transistor SRAM (8T-SRAM) cell according to a first preferred embodiment of the present invention, and FIG. 2 illustrates a layout diagram of an 8T-SRAM according to the first preferred embodiment of the present invention.

Please referring to FIG. 1, in this embodiment, each 8T-SRAM cell 10 is composed of a first pull-up transistor PU1, a second pull-up transistor PU2, and a first pull-down transistor PD1, a second pull-down transistor PD2, a first pass gate transistor PG1A, a second pass gate transistor PG1B, a third pass gate transistor PG2A and a fourth pass gate transistor PG2B. These eight transistors constitute a set of flip-flops. The first and the second pull-up transistors PU1 and PU2, and the first and the second pull-down transistors PD1 and PD2 constitute a latch circuit that stores data in the storage nodes 24 and 26. Since the first and the second pull-up transistors PU1 and PU2 act as power load devices, they can be replaced by resistors. Under this circumstance, the static random access memory becomes a four-transistor SRAM (4T-SRAM). In this embodiment, the first and the second pull-up transistors PU1 and PU2 preferably share a source/drain region and electrically connect to a voltage source (voltage node) Vcc, and the first and the second pull-down transistors PD1 and PD2 share a source/drain region and electrically connect to a voltage source (voltage node) Vss.

Preferably, the first and the second pull-up transistors PU1 and PU2 of the 8T-SRAM cell 10 are composed of p-type metal oxide semiconductor (PMOS) transistors; the first and the second pull-down transistors PD1 and PD2, the first pass gate transistors PG1A, the second pass gate transistors PG1B, the third pass gate transistors PG2A and the fourth pass gate transistors PG2B composed of n-type metal oxide semiconductor (NMOS) transistors, but not limited thereto. The first pull-up transistor PU1 and the first pull-down transistor PD1 constitute an inverter, which further form a series circuit 28. One end of the series circuit 28 is connected to a voltage source Vcc and the other end of the series circuit 28 is connected to a voltage source Vss. Similarly, the second pull-up transistor PU2 and the second pull-down transistor PD2 constitute another inverter and a series circuit 30. One end of the series circuit 30 is connected to the voltage source Vcc and the other end of the series circuit 30 is connected to the voltage source Vss. Each pass gate transistors (including the first pass gate transistor PG1A, the second pass gate transistor PG1B, the third pass gate transistor PG2A and the fourth pass gate transistor PG2B) configured with the two cross-coupled inverters respectively, wherein each of the at least one pull-up transistor (PLs), the at least one pull-down transistors (PDs), and the at least two pass gate transistor (PGs) includes a fin field-effect transistor (FinFET).

The storage node 24 is connected to the respective gates of the second pull-down transistor PD2 and the second pull-up transistor PU2. The storage node 24 is also connected to the drains of the first pull-down transistor PD1, the first pull-up transistor PU1, the first pass gate transistor PG1A and the second pass gate transistor PG1B. Similarly, the storage node 26 is connected to the respective gates of the first pull-down transistor PD1 and first the pull-up transistor PU1. The storage node 26 is also connected to the drains of the second pull-down transistor PD2, the second pull-up transistor PU2, the third pass gate transistor PG2A and the fourth pass gate transistor PG2B. The gates of the first pass gate transistor PG1A and the third pass gate transistor PG1B are respectively coupled to a first word line (WL1); the gates of the second pass gate transistor PG1B and the fourth pass gate transistor PG2B are respectively coupled to a second word line (WL2); the source of the first pass gate transistor PG1A is coupled to a first bit line (BL1); the source of the second pass gate transistor PG1B is coupled to a second bit line (BL2); the source of the third pass gate transistor PG2A is coupled to a third bit line (BL3); and the source of the fourth pass gate transistor PG2B is coupled to a fourth bit line (BL4).

Please refer to FIG. 2. In this embodiment, the 8T-SRAM cell 10 is located in a region 50 and is arranged on a substrate 52, such as a silicon substrate or a silicon-on-insulator (SOI) substrate. A plurality of fin structures 54 arranged in parallel are arranged on the substrate 52, and shallow trench isolation (not shown) is arranged around each fin structure 54.

In addition, the substrate 52 includes a plurality of gate structures 56, and each transistor (including the first pull-up transistor PU1, the first pull-down transistor PD1, the second pull-up transistor PU2, the second pull-down transistor PD2, the first access transistor PG1A, the second access transistor PG1B, the third access transistor PG2A and the fourth access transistor PG2B) includes a gate structure 56 spanning at least one fin structure 54 to form each transistor.

As shown in FIG. 2, in order to clearly define the position of each gate structure 56, the gate structures 56 are labeled as a first gate structure 56A, a second gate structure 56B, a third gate structure 56C, a fourth gate structure 56D, a fifth gate structure 56E, a sixth gate structure 56F, a dummy gate structure 56G and a dummy gate structure 56H. The first gate structure 56A spans the fin structure 54 to form the first access transistor PG1A, the second gate structure 56B spans the fin structure 54 to form a second access transistor PG1B, the third gate structure 56C spans the fin structure 54 to form a third access transistor PG2A, the fourth gate structure 56D spans the fin structure 54 to form a fourth access transistor PG2B, the fifth gate structure 56E spans at least two different fin structures 54 to form a second pull-up transistor PU2 and a second pull-down transistor PD2, the sixth gate structure 56F spans at least two different fin structures 54 to form a first pull-up transistor PU1 and a first pull-down transistor PD1. However, it is not understandable that the first gate structure 56A to the sixth gate structure 56F belong to the gate structure 56.

In the present invention, each gate structure 56 is arranged along a first direction (for example, X direction), and each fin structure 54 is arranged along a second direction (for example, Y direction). Preferably, the first direction and the second direction are perpendicular to each other.

In addition, when the first gate structure 56A to the sixth gate structure 56F are fabricated, at least one long gate structure (not shown) is first formed, and then the long gate structure is cut by photolithography, etching and other steps, and divided into a plurality of gate structures. The above steps can be called a cutting process. As shown in FIG. 2, the first gate structure 56A, the third gate structure 56C and the fifth gate structure 56E are divided by the same gate structure. The second gate structure 56F, the fourth gate structure 56D and the sixth gate structure 56F are divided by the same gate structure.

In addition, although the dummy gate structure 56G and the dummy gate structure 56H span the fin structure 54, but they do not form the transistors in the 8T-SRAMory cell 10. In this embodiment, the dummy gate structure 56G and the dummy gate structure 56H are the remaining parts when the above-mentioned cutting step is performed on the long gate structure. However, in other embodiments of the present invention, the pattern of the cutting process can also be selectively changed, for example, the dummy gate structure 56G and the dummy gate structure 56H mentioned here can also be connected to other gate structures (for example, the fifth gate structure 56E and the sixth gate structure 56F are respectively connected) without being cut.

The present invention further comprises a first local interconnection layer 60A and a second local interconnection layer 60B arranged in a first direction. The first local interconnection layer 60A crosses over the fin structure 54 of the first pull-up transistor PU1, the fin structure 54 of the first pull-down transistor PD1, the fin structure 54 of the first pass gate transistor PG1A and the fin structure 54 of the second pass gate transistor PG1B. The second local interconnection layer 60B crosses the fin structure 54 of the second pull-up transistor PU2, the fin structure 54 of the second pull-down transistor PD2, the fin structure 54 of the third pass gate transistor PG2A, and the fin structure 54 of the fourth pass gate transistor PG2B.

In addition, the substrate 52 includes a plurality of conductive layers 62 and conductive layers 63 for connecting different transistors (for example, connecting the gate of the second pull-up transistor PU2 and the drain of the first pull-up transistor PU1) or connecting each transistor to other elements (for example, connecting the source of the first pull-up transistor PU1 to the voltage source Vcc). In addition, in FIG. 2, the corresponding connected elements of each contact structure (such as voltage source Vcc, voltage source Vss, first word line WL1, second word line WL2, first bit line BL1, second bit line BL, third bit line BL3 and fourth bit line BL4) are directly labeled on each conductive layer 62 or 63 to clearly express the corresponding elements of each conductive layer 62 and 63. The conductive layer 62 and the conductive layer 63 can be made of the same or different materials, but both of them contain conductive materials. In addition, the conductive layer 62 or the conductive layer 63 can also be formed by the same step or by different steps, which are within the scope of the present invention. In this embodiment, the main difference between the conductive layer 62 and the conductive layer 63 is that the connected elements are different. For example, the conductive layer 62 directly connects the gate structures, while the conductive layer 63 does not directly connect the gate structures, but connects the source/drain regions of the transistor.

Figure 3:
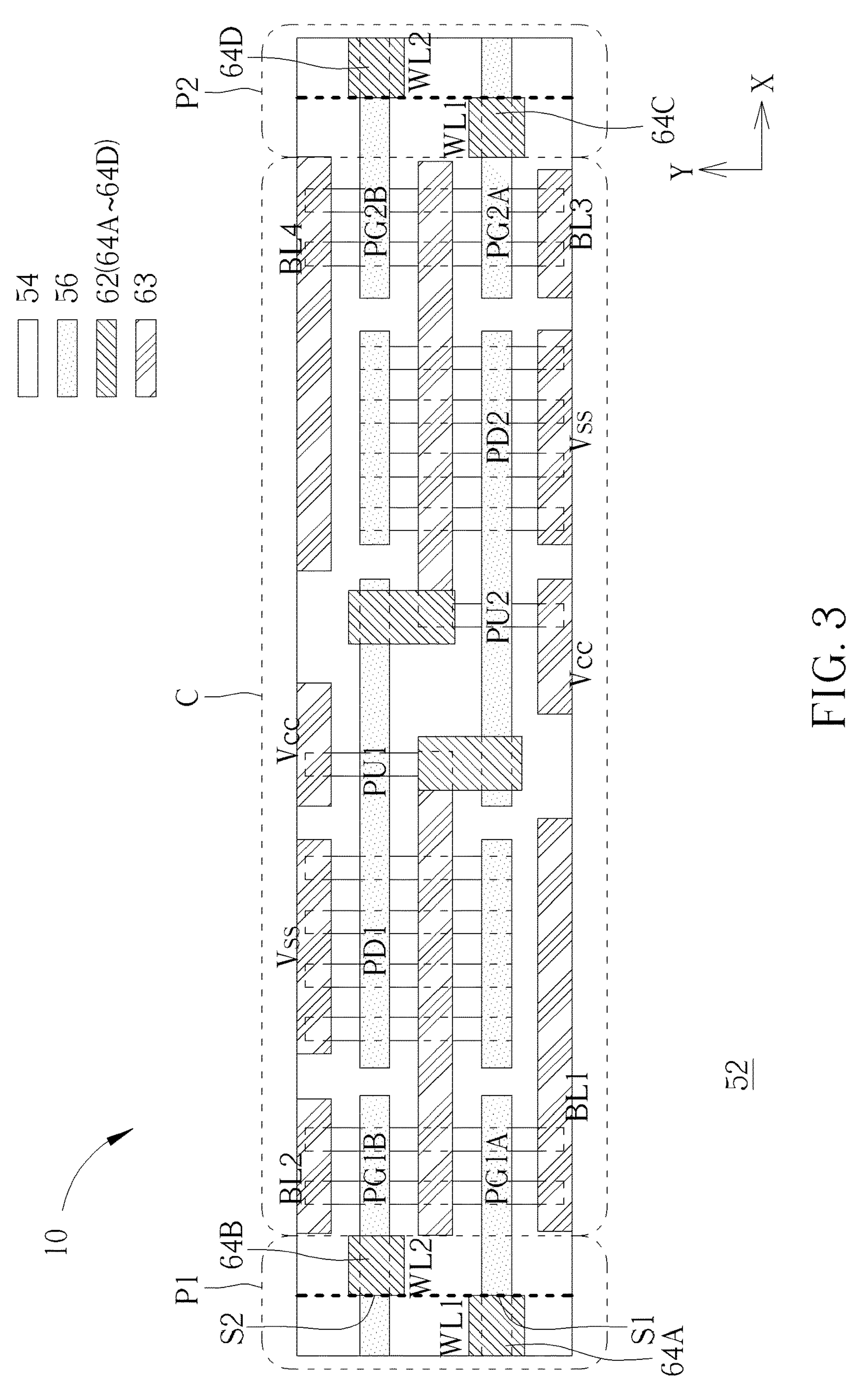
FIG. 3 shows a schematic diagram of defining a central region and a peripheral region based on the layout of the SRAM shown in FIG. 2.

In addition, the present invention defines a word line contact pad 64A, a word line contact pad 64B, a word line contact pad 64C and a word line contact pad 64D. The word line contact pad 64A contacts and electrically connects with the first gate structure 56A, the word line contact pad 64B contacts and electrically connects the second gate structure 56B, the word line contact pad 64C contacts and electrically connects the third gate structure 56C, the word line contact pad 64D contacts and electrically connects the fourth gate structure 56D. The word line contact pads 64A-64D mentioned here belong to a part of the conductive layer 62, which can be made of the same material as the conductive layer 62. One feature of the present invention is the arrangement and position of the word line contact pads 64A-64D, so some conductive layer 62 are labeled as word line contact pads 64A-64D respectively to clearly illustrate the characteristics of the present invention, as shown in the following paragraph:

FIG. 3 shows a schematic diagram of defining a central region and a peripheral region based on the layout of the SRAM shown in FIG. 2. As shown in FIG. 3, a central region C and two peripheral regions P1 and P2 are defined on the 8T-SRAM cell 10, and the peripheral regions P1 and P2 are located on both sides of the central region C respectively. The central region C contains most elements of the 8T-SRAM cell 10, such as transistors, fin structures, a plurality of gate structures and a plurality of metal layers, which are located in the central region C, and the peripheral region P1 includes the word line contact pads 64A, the word line contact pads 64B, a part of the first gate structure 56A and a part of the second gate structure 56B. The peripheral region P2 includes the word line contact pad 64C, the word line contact pad 64D, a part of the third gate structure 56C and a part of the fourth gate structure 56D.

As the size of SRAM pattern is gradually shrinking, for a single peripheral region, if the word line contact pads overlap or partially overlap in the longitudinal direction (Y direction), the spacing distance between the word line contact pads will be too small to be fabricated, which will further affect the formation quality of the device. For example, in the current technology, if the gap between two word line contact pads is less than about 50 nanometers, it may cause difficulties in manufacturing.

Therefore, as shown in FIG. 3, one of the features of the present invention is that the word line contact pads 64A~64D in the peripheral region P1 or the peripheral region P2 are arranged in a staggered manner. More specifically, take the peripheral region P1 as an example, in which the word line contact pads 64A and 64B do not overlap in the longitudinal direction (Y direction), that is, there is no overlap between the word line contact pads 64A and 64B in the longitudinal direction. Preferably, one side of the word line contact pad 64A (e.g., the side S1 indicated in FIG. 3) can be controlled to be aligned with the other side of the word line contact pad 64B (e.g., the side S2 indicated in FIG. 3) in the Y direction, so that the size of the device can be reduced as much as possible and the width (the length in the X direction) of the device can be prevented from being excessively elongated.

The structures shown in FIG. 2 and FIG. 3 show the layout pattern of an 8T-SRAM cell. In the following steps, other dielectric layers, contact structures and metal layers will be formed and stacked on the above layout patterns. Since the present invention does not limit the shape and number of subsequent contact structures and metal layers, it is not described in detail here.

In addition, in the above embodiment, each transistor is a fin transistor, including a gate structure formed on the fin structure. However, in the present invention, each transistor may also include a planar transistor, that is, a plurality of diffusion regions are formed to replace the above fin structures.

Another feature of the present invention is that for each 8T-SRAM cell, the relative arrangement positions of the word line contact pads in the peripheral region P1 and the peripheral region P2 are the same. For example, taking FIG. 2 as an example, the word line contact pads 64A and 64B are included in the peripheral region P1, and the word line contact pads 64A and 64B are located in the upper right and lower left of the peripheral region P1 respectively (hereinafter referred to as upper right and lower left arrangement). Similarly, the word line contact pad 64C and the word line contact pad 64D are included in the peripheral region P2, and the word line contact pad 64C and the word line contact pad 64D are located in the upper right and lower left of the peripheral region P2, respectively. This arrangement is helpful for each word line contact pad to be staggered with other adjacent word line contact pads in the longitudinal direction after a plurality of 8T-SRAM cells are arranged in an array. Details are shown in FIGS. 4 and 5 as follows.

Figure 4:
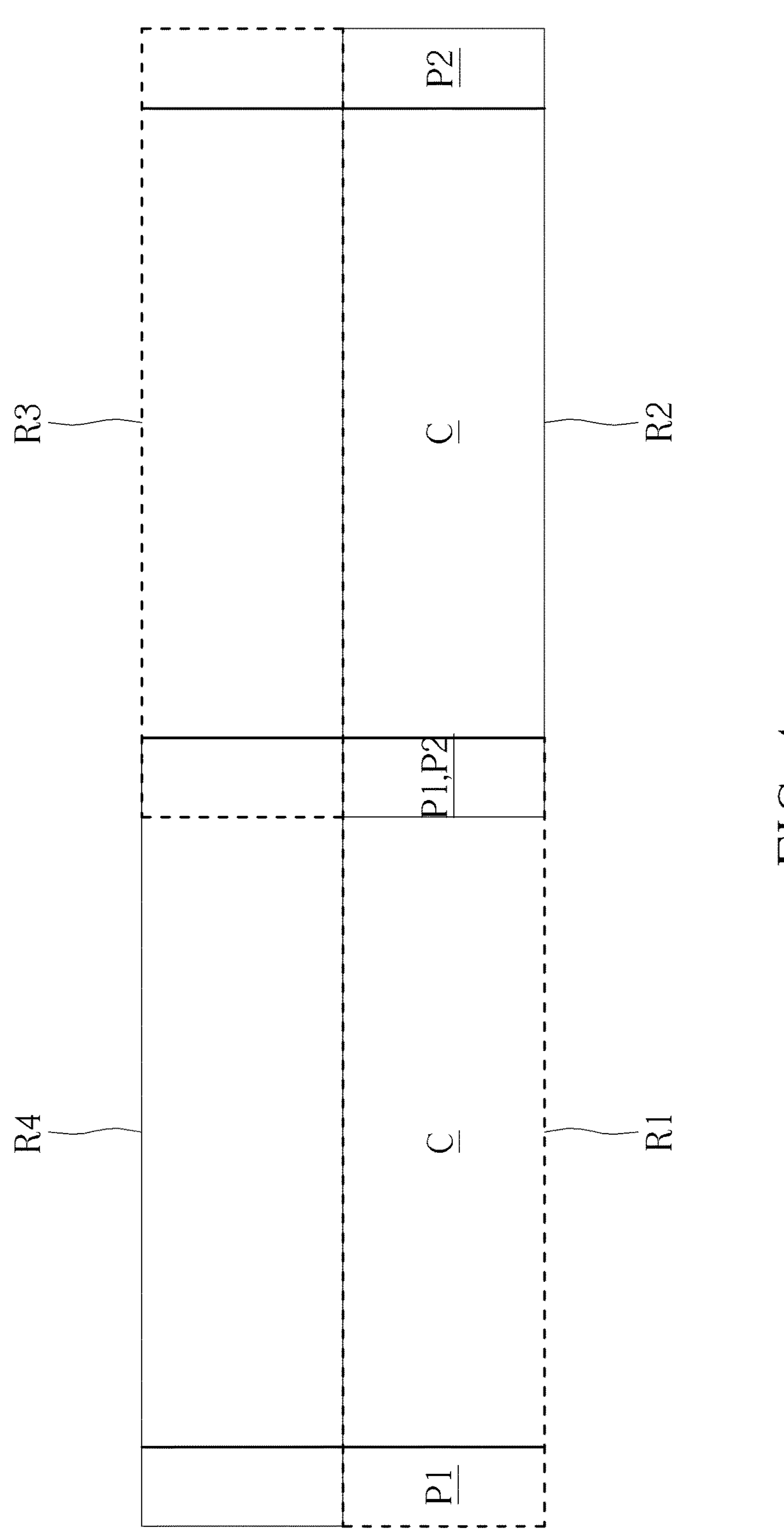
FIG. 4 shows a schematic diagram of arranging 8T-SRAM cells of the present invention into a 2*2 array.
Figure 5:
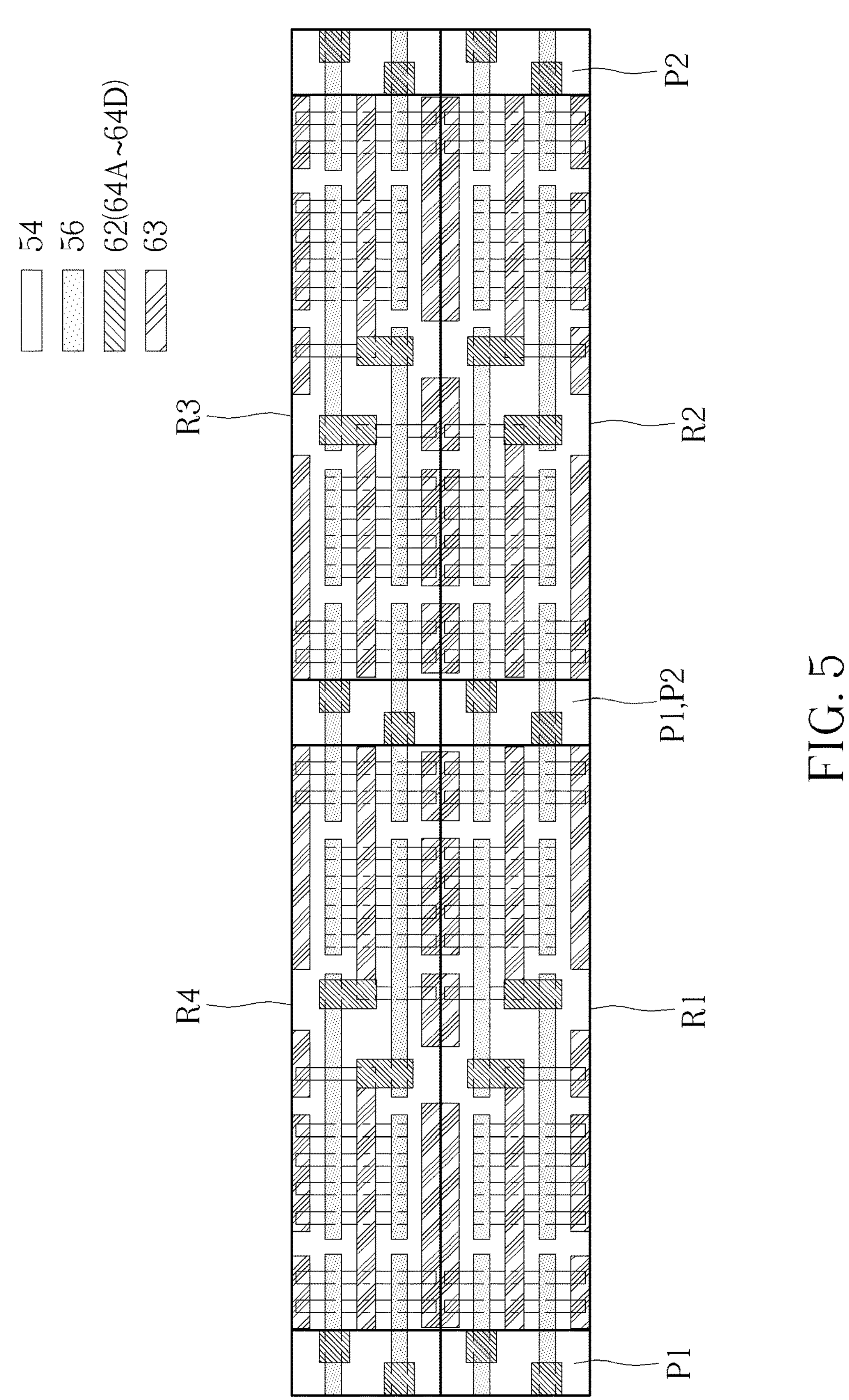
FIG. 5 is a schematic diagram showing the layout pattern of 8T-SRAM cells arranged in a 2*2 array according to the present invention.

FIG. 4 shows a schematic diagram of arranging the 8T-SRAM cells of the present invention into a 2*2 array, and FIG. 5 shows a schematic diagram of the layout pattern of arranging the 8T-SRAM cells of the present invention into a 2*2 array. As shown in FIG. 4 and FIG. 5, 8T-SRAM cells are arranged in a 2*2 array, which can be respectively marked as a first SRAM cell region R1, a second SRAM cell region R2, a third SRAM cell region R3 and a fourth SRAM cell region R4. The first SRAM cell region R1 and the second SRAM cell region R2 are aligned in the X direction, the third SRAM cell region R3 and the fourth SRAM cell region R4 are aligned in the X direction, the first SRAM cell region R1 and the fourth SRAM cell region R4 are aligned in the Y direction, and the second SRAM cell region R2 and the third SRAM cell region R3 are aligned in the Y direction. Furthermore, the pattern of the 8T-SRAM cell 10 shown in FIG. 2 may correspond to the pattern of the second SRAM cell region R2 or the pattern of the fourth SRAM cell region R4 shown in FIG. 5. For the sake of simplicity, some component numbers may be omitted in FIG. 5, but detailed component numbers can be shown in FIG. 2 or FIG. 3.

It is worth noting that when the first to fourth SRAM cell regions R1 to R4 are arranged in an array, the peripheral region of each SRAM cell region will be shared with other SRAM cell regions adjacent in the lateral direction (X direction). For example, the first SRAM cell region R1 and the second SRAM cell region R2 share the peripheral region, that is, the peripheral region P2 of the first SRAM cell region R1 is equal to the peripheral region P1 of the second SRAM cell region R2. Similarly, the peripheral region P1 of the third SRAM cell region R3 is equivalent to the peripheral region P2 of the fourth SRAM cell region R4, in other words, the two regions share the peripheral region.

In addition, please refer to FIG. 5. It is worth noting that in the 2*2 array in which 8T-SRAM cells are arranged, the patterns of the central region C of the first SRAM cell region R1 and the third SRAM cell region R3 are the same, and the patterns of the central region C of the second SRAM cell region R2 and the fourth SRAM cell region R4 are the same, and the word line contact pads in the peripheral regions P1 and P2 are also the same (as shown in FIG. 5, they are all arranged in the upper right and lower left arrangement). However, the pattern of the central region C of the first SRAM cell region R1 is a mirror pattern (for example, a mirror pattern along the X axis) with the pattern of the central region C of the second SRAM cell region R2 or the fourth SRAM cell region R4. However, it is worth noting that although the patterns of the central region C in different regions may be the same or different from each other, the arrangement of the word line contact pads included in the peripheral region P1 or P2 of each region (the first SRAM cell region R1 to the fourth SRAM cell region R4) is the same (for example, the upper right and lower left arrangement).

In other words, the above arrangement can make the patterns of the central region C of the adjacent regions (for example, the first SRAM cell region R1 and the fourth SRAM cell region R4) in the 2*2 array mirror each other, but the peripheral regions P1 and P2 are not mirror images, but are all designed in the same arrangement pattern (for example, the upper right and lower left arrangement). In this way, two adjacent central regions C can share a part of components, such as metal layers, and the word line contact pads are kept in staggered arrangement, so as to avoid the difficulties in the manufacturing process caused by the close distance between adjacent word line contact pads.

FIG. 4 and FIG. 5 show that 8T-SRAM cells are arranged in a 2*2 array, and the present invention can arrange 8T-SRAM cells in a larger array according to this arrangement. It is worth noting that in the 8T-SRAM array, any 8T-SRAM cell will share the peripheral region with two adjacent 8T-SRAM cells on the left and right sides respectively. Other features can be shown in FIG. 5, and will not be repeated here.

Based on the above description and drawings, a layout pattern of static random-access memory (SRAM) of the present invention includes a substrate 52, a plurality of fin structures 54 located on the substrate 52, each fin structure 52 extending along a second direction (Y direction), and a plurality of gate structures 56 located on the substrate 52, each gate structure 56 extending along a first direction (X direction), and spans a plurality of fin structures 54 to form a plurality of transistors. The transistors include a first pull-up transistor (PU1), a first pull-down transistor (PD1), a second pull-up transistor (PU2), a second pull-down transistor (PD2), a first access transistor (PG1A), a second access transistor (PG1B), a third access transistor (PG2A) and a fourth access transistor (PG2B). A first word line contact pad 64A connected to a gate of the first access transistor (PG1A) and a first word line WL1, and a second word line contact pad 64B connected to a gate of the second access transistor (PG1B) and a second word line WL2, wherein the first word line contact pad 64A and the second word line contact pad 64B do not overlap in the second direction.

In some embodiments of the present invention, the layout pattern of the SRAM further includes: a first inverter including a first pull-up transistor (PU1) and a first pull-down transistor (PD1) located on the substrate, and a second inverter including a second pull-up transistor (PU2) and a second pull-down transistor (PD2) located on the substrate, wherein the first inverter and the second inverter are coupled with each other.

In some embodiments of the present invention, the first access transistor (PG1A) and the second access transistor (PG1B) are connected to the output terminal of the first inverter, and the third access transistor (PG2A) and the fourth access transistor (PG2B) are connected to the output terminal of the second inverter.

In some embodiments of the present invention, one side S1 of the first word line contact pad 64A and one side S2 of the second word line contact pad 64B are aligned with each other in the second direction (Y direction).

In some embodiments of the present invention, the first access transistor PG1A includes a first gate structure 56A, the second access transistor PG1B includes a second gate structure 56B, the third access transistor PG2A includes a third gate structure 56C, the fourth access transistor PG2B includes a fourth gate structure 56D, the second pull-up transistor PU2 and the second pull-down transistor PD2 include a fifth gate structure 56E, the first pull-up transistor PU1 and the first pull-down transistor PD1 include a sixth gate structure 56F.

In some embodiments of the present invention, it further includes a third word line contact pad 64C located on the third gate structure 56C and connected to the first word line WL, and a fourth word line contact pad 64D located on the fourth gate structure 56D and connected to a second word line WL2, the third word line contact pad 64C and the fourth word line contact pad 64D do not overlap in the second direction (Y direction).

In some embodiments of the present invention, a first dummy gate structure 56G is further included, which is located between the first gate structure 56A and the fifth gate structure 56E and aligned with the first gate structure 56A and the fifth gate structure 56E in the first direction (X direction).

In some embodiments of the present invention, the first dummy gate structure 56G does not contact the first gate structure 56A, the fifth gate structure 56E or the sixth gate structure 56F.

In some embodiments of the present invention, a first local interconnection layer 60A is located between the first access transistor PG1A and the second access transistor PG1B and on the fin structure included in the first pull-up transistor PU1 and the first pull-down transistor PD1, and a second local interconnection layer 60B is located between the third access transistor PG2A and the fourth access transistor PG2B and on the fin structure included in the second pull-up transistor PU2 and the second pull-down transistor PD2.

In some embodiments of the present invention, the first local interconnection layer 60A and the second local interconnection layer 60B are arranged along the first direction (X direction).

In some embodiments of the present invention, the first access transistor PG1A and the second access transistor PG1B comprise the same fin structure 54A, and the third access transistor PG2A and the fourth access transistor PG2B comprise the same fin structure 54B.

In some embodiments of the present invention, a first bit line BL1 is connected to the first access transistor PG1A, a second bit line BL2 is connected to the second access transistor PG1B, a third bit line BL3 is connected to the third access transistor PG2A, and a fourth bit line BL4 is connected to the fourth access transistor PG2B.

The invention further provides a layout pattern of static random-access memory (SRAM), which comprises a substrate 52 and four SRAM cell regions (R1, R2, R3, R4) arranged in a 2*2 array to form the layout pattern of SRAM, wherein each SRAM cell region comprises a plurality of fin structures 54 located on the substrate 52. Each fin structure 54 extends along a second direction (Y direction), a plurality of gate structures 54 are located on the substrate 52, and each gate structure 56 extends along a first direction (X direction) and spans the plurality of fin structures 54 to form a plurality of transistors. The plurality of transistors comprise a first pull-up transistor (PU1), a first pull-down transistor (PD1), a second pull-up transistor (PU2), a second pull-down transistor (PD2), a first access transistor (PG1A), a second access transistor (PG1B), a third access transistor (PG2A) and a fourth access transistor (PG2B). A first word line contact pad 64A connected to a gate of the first access transistor (PG1A) and a first word line WL1, a second word line contact pad 64B connected to a gate of the second access transistor (PG1B) and a second word line WL2, wherein the first word line contact pad 64A and the second word line contact pad 64B do not overlap in the second direction (Y direction). A third word line contact pad 64C connected to a gate of the third access transistor (PG2A) and the first word line WL1, and a fourth word line contact pad 64D connected to a gate of the fourth access transistor (PG2B) and the second word line WL2, wherein the third word line contact pad 64C and the fourth word line contact pad 64D do not overlap in the second direction.

In some embodiments of the present invention, the four SRAM cell regions include a first SRAM cell region R1, a second SRAM cell region R2, a third SRAM cell region R3 and a fourth SRAM cell region R4, wherein the first SRAM cell region R1 and the second SRAM cell region R2 are aligned in the first direction (X direction). The first SRAM cell region R1 and the fourth SRAM cell region R4 are aligned in the second direction (Y direction), and the first SRAM cell region R1 and the third SRAM cell region R3 are located on the diagonal of the array.

In some embodiments of the present invention, the first SRAM cell region R1 partially overlaps with a second SRAM cell region R2, and the third word line contact pad 64C in the first SRAM cell region R1 and the first word line contact pad 64A in the second SRAM cell region R1 are the same structure (that is, the peripheral region P2 of the first SRAM cell region R1 and the peripheral region P1 of the second SRAM cell region R2 are the same region, that is, they share the peripheral region).

In some embodiments of the present invention, the first SRAM cell region R1 partially overlaps with a second SRAM cell region R2, and the fourth word line contact pad 64D in the first SRAM cell region R1 and the second word line contact pad 64B in the second SRAM cell region R2 are the same structure (that is, the peripheral region P2 of the first SRAM cell region R1 and the peripheral region P1 of the second SRAM cell region R2 are the same region, that is, they share the peripheral region).

In some embodiments of the present invention, the first SRAM cell region R1 and the third SRAM cell region R3 contain the same pattern, and the second SRAM cell region R2 and the fourth SRAM cell region R4 contain the same pattern.

In some embodiments of the present invention, the first SRAM cell region R1 and the second SRAM cell region R2 contain different patterns (the patterns in the central region C are mirror images of each other).

In some embodiments of the present invention, the relative position relationship between the first word line contact pad 64A and the second word line contact pad 64B is equal to the relative position relationship between the third word line contact pad 64C and the fourth word line contact pad 64D in any one of the four SRAM cell regions (all arranged in the upper right and lower left arrangement).

In some embodiments of the present invention, any two SRAM cell regions in the four SRAM cell regions include the first word line contact pad 64A, the second word line contact pad 64B, the third word line contact pad 64C and the fourth word line contact pad 64D in the same arrangement (all arranged in the upper right and lower left arrangement).

To sum up, the present invention provides a layout pattern of a 8T-SRAM cell and a layout pattern of a combined array. One of the features of the present invention is that the word line contact pads contained therein are staggered, so as to avoid manufacturing difficulties caused by being too close to other adjacent word line contact pads. Another feature is that when a plurality of 8T-SRAM cells are arranged in an array, the patterns in the central region will mirror each other for different adjacent regions, but the word line contact pads in the peripheral regions still maintain the same arrangement direction, so that each region in the array and the word line contact pads in the adjacent regions can be staggered, and the yield of products can be improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern of a static random-access memory (SRAM), comprising:

a substrate;

a plurality of fin structures are located on the substrate, and each fin structure extends along a second direction, wherein the second direction is Y direction in the X-Y coordinate;

a plurality of gate structures are located on the substrate, and each gate structure extends along a first direction and spans the plurality of fin structures to form a plurality of transistors, wherein the first direction is X direction in the X-Y coordinate, wherein the plurality of transistors comprise a first pull-up transistor (PU1), a first pull-down transistor (PD1), a second pull-up transistor (PU2), a second pull-down transistor (PD2), a first access transistor (PG1A), a second access transistor (PG1B), a third access transistor (PG2A) and a fourth access transistor (PG2B), wherein the first access transistor (PG1A) includes a first gate structure, the second access transistor (PG1B) includes a second gate structure, the third access transistor (PG2A) includes a third gate structure, the fourth access transistor (PG2B) includes a fourth gate structure, the second pull-up transistor (PU2) and the second pull-down transistor (PD2) include a fifth gate structure, and the first pull-up transistor (PU1) and the first pull-down transistor (PD1) include a sixth gate structure;

a first dummy gate structure located between the first gate structure and the fifth gate structure and aligned with the first gate structure and the fifth gate structure in the first direction, wherein the first dummy gate structure does not contact the first gate structure, the fifth gate structure or the sixth gate structure;

a first word line contact pad connected to a gate of the first access transistor (PG1A) and a first word line; and a second word line contact pad connected to a gate of the second access transistor (PG1B) and a second word line, wherein the first word line contact pad and the second word line contact pad do not overlap in the second direction.

2. The layout pattern of the SRAM according to claim 1, wherein the layout pattern of the SRAM further comprising:

a first inverter including the first pull-up transistor (PU1) and the first pull-down transistor (PD1) located on the substrate;

a second inverter including the second pull-up transistor (PU2) and the second pull-down transistor (PD2) located on the substrate, wherein the first inverter and the second inverter are coupled with each other.

3. The layout pattern of the SRAM according to claim 2, wherein the first access transistor (PG1A) and the second access transistor (PG1B) are connected to an output terminal of the first inverter, and the third access transistor (PG2A) and the fourth access transistor (PG2B) are connected to an output terminal of the second inverter.

4. The layout pattern of the SRAM according to claim 1, wherein one side of the first word line contact pad and one side of the second word line contact pad are aligned with each other in the second direction.

5. The layout pattern of the SRAM according to claim 1, further comprising:

a third word line contact pad located on the third gate structure and connected to the first word line; and a fourth word line contact pad located on the fourth gate structure and connected to the second word line, wherein the third word line contact pad and the fourth word line contact pad do not overlap in the second direction.

6. The layout pattern of the SRAM according to claim 1, further comprising:

a first local interconnection layer located between the first access transistor (PG1A) and the second access transistor (PG1B) and located on the fin structure included in the first pull-up transistor (PU1) and the first pull-down transistor (PD1); and a second local interconnection layer located between the third access transistor (PG2A) and the fourth access transistor (PG2B) and located on the fin structure included in the second pull-up transistor (PU2) and the second pull-down transistor (PD2).

7. The layout pattern of SRAM according to claim 6, wherein the first local interconnection layer and the second local interconnection layer are arranged along the first direction.

8. The layout pattern of the SRAM according to claim 1, wherein the first access transistor (PG1A) and second access transistor (PG1B) comprise the same fin structure, and the third access transistor (PG2A) and fourth access transistor (PG2B) comprise another same fin structure.

9. The layout pattern of the SRAM according to claim 1, further comprising a first bit line connected to the first access transistor (PG1A), a second bit line connected to the second access transistor (PG1B), a third bit line connected to the third access transistor (PG2A) third access transistor and a fourth bit line connected to the fourth access transistor (PG2B).

10. A layout pattern of a static random-access memory (SRAM), comprising:

a substrate;

four SRAM cell regions, which are arranged in a 2×2 array and form the layout pattern of the SRAM, wherein each SRAM cell region comprises:

a plurality of fin structures are located on the substrate, and each fin structure extends along a second direction, wherein the second direction is Y direction in the X-Y coordinate;

a plurality of gate structures are located on the substrate, and each gate structure extends along a first direction and spans the plurality of fin structures to form a plurality of transistors, wherein the first direction is X direction in the X-Y coordinate, wherein the plurality of transistors comprise a first pull-up transistor (PU1), a first pull-down transistor (PD1), a second pull-up transistor (PU2), a second pull-down transistor (PD2), a first access transistor (PG1A), a second access transistor (PG1B), a third access transistor (PG2A) and a fourth access transistor (PG2B, wherein the first access transistor (PG1A) includes a first gate structure, the second access transistor (PG1B) includes a second gate structure, the third access transistor (PG2A) includes a third gate structure, the fourth access transistor (PG2B) includes a fourth gate structure, the second pull-up transistor (PU2) and the second pull-down transistor (PD2) include a fifth gate structure, and the first pull-up transistor (PU1) and the first pull-down transistor (PD1) include a sixth gate structure;

a first dummy gate structure located between the first gate structure and the fifth gate structure and aligned with the first gate structure and the fifth gate structure in the first direction, wherein the first dummy gate structure does not contact the first gate structure, the fifth gate structure or the sixth gate structure;

a first word line contact pad connected to a gate of the first access transistor (PG1A) and a first word line;

a second word line contact pad connected to a gate of the second access transistor (PG1B) and a second word line, wherein the first word line contact pad and the second word line contact pad do not overlap in the second direction;

a third word line contact pad connected to a gate of the third access transistor (PG2A) and the first word line; and a fourth word line contact pad connected to a gate of the fourth access transistor (PG2B) and the second word line, wherein the third word line contact pad and the fourth word line contact pad do not overlap in the second direction.

11. The layout pattern of SRAM according to claim 10, wherein the four SRAM cell regions include a first SRAM cell region, a second SRAM cell region, a third SRAM cell region and a fourth SRAM cell region, wherein the first SRAM cell region and the second SRAM cell region are aligned in the first direction, and the first SRAM cell region and the fourth SRAM cell region are aligned in the second direction.

12. The layout pattern of SRAM according to claim 11, wherein the first SRAM cell region partially overlaps with the second SRAM cell region, and the third word line contact pad in the first SRAM cell region and the first word line contact pad in the second SRAM cell region are the same structure.

13. The layout pattern of SRAM according to claim 11, wherein the first SRAM cell region partially overlaps with the second SRAM cell region, and the fourth word line contact pad in the first SRAM cell region and the second word line contact pad in the second SRAM cell region are the same structure.

14. The layout pattern of the SRAM according to claim 11, wherein the first SRAM cell region and the third SRAM cell region comprise the same pattern, and the second SRAM cell region and the fourth SRAM cell region comprise the same pattern.

15. The layout pattern of the SRAM according to claim 14, wherein the first SRAM cell region and the second SRAM cell region comprise different patterns.

16. The layout pattern of the SRAM according to claim 10, wherein the relative positional relationship between the first word line contact pad and the second word line contact pad is equal to the relative positional relationship between the third word line contact pad and the fourth word line contact pad in any one of the four SRAM cell regions.

17. The layout pattern of the SRAM according to claim 10, wherein any two SRAM cell regions in the four SRAM cell regions include the first word line contact pad, the second word line contact pad, the third word line contact pad and the fourth word line contact pad in the same arrangement.

* * * * *